(12) United States Patent
Pochmüller

(10) Patent No.: US 7,193,426 B2
(45) Date of Patent: Mar. 20, 2007

(54) TEST SYSTEM AND TEST STRUCTURE FOR TESTING AN INTEGRATED CIRCUIT AND AN INTEGRATED CIRCUIT HAVING A TEST STRUCTURE

(75) Inventor: Peter Pochmüller, Dresden (DE)

(73) Assignee: Infineon Technologies AG, Munich (DE)

( * ) Notice: Subject to any disclaimer, the term of this patent is extended or adjusted under 35 U.S.C. 154(b) by 76 days.

(21) Appl. No.: 11/013,873

(22) Filed: Dec. 16, 2004

(65) Prior Publication Data

US 2005/0156612 A1 Jul. 21, 2005

(30) Foreign Application Priority Data

Dec. 16, 2003 (DE) .............................. 103 58 849

(51) Int. Cl.
*G01R 31/28* (2006.01)
*G01R 31/02* (2006.01)
*G01R 31/26* (2006.01)

(52) U.S. Cl. .................... 324/763; 324/765; 324/158.1; 714/734

(58) Field of Classification Search ................ 324/763
See application file for complete search history.

(56) References Cited

U.S. PATENT DOCUMENTS

| | | | |
|---|---|---|---|
| 5,574,369 A | * | 11/1996 | Hibbs .......................... 324/248 |
| 5,883,521 A | | 3/1999 | Nishikawa |
| 6,286,117 B1 | | 9/2001 | Yun et al. |

OTHER PUBLICATIONS

German Patent Office Examination Report dated Aug. 6, 2004.

* cited by examiner

*Primary Examiner*—Vinh Nguyen
*Assistant Examiner*—Emily Y Chan
(74) *Attorney, Agent, or Firm*—Patterson & Sheridan, L.L.P.

(57) ABSTRACT

One embodiment of the invention relates to a test structure for testing an integrated circuit with a tester unit that has one or more connecting lines to connect the integrated circuit, wherein a test signal and/or a supply voltage is applied to the integrated circuit for the purposes of testing, and an interference unit connected to at least one of the connecting lines which applies an interference signal to the connecting line to reduce the quality of the test signal and/or the quality of the supply voltage.

6 Claims, 4 Drawing Sheets

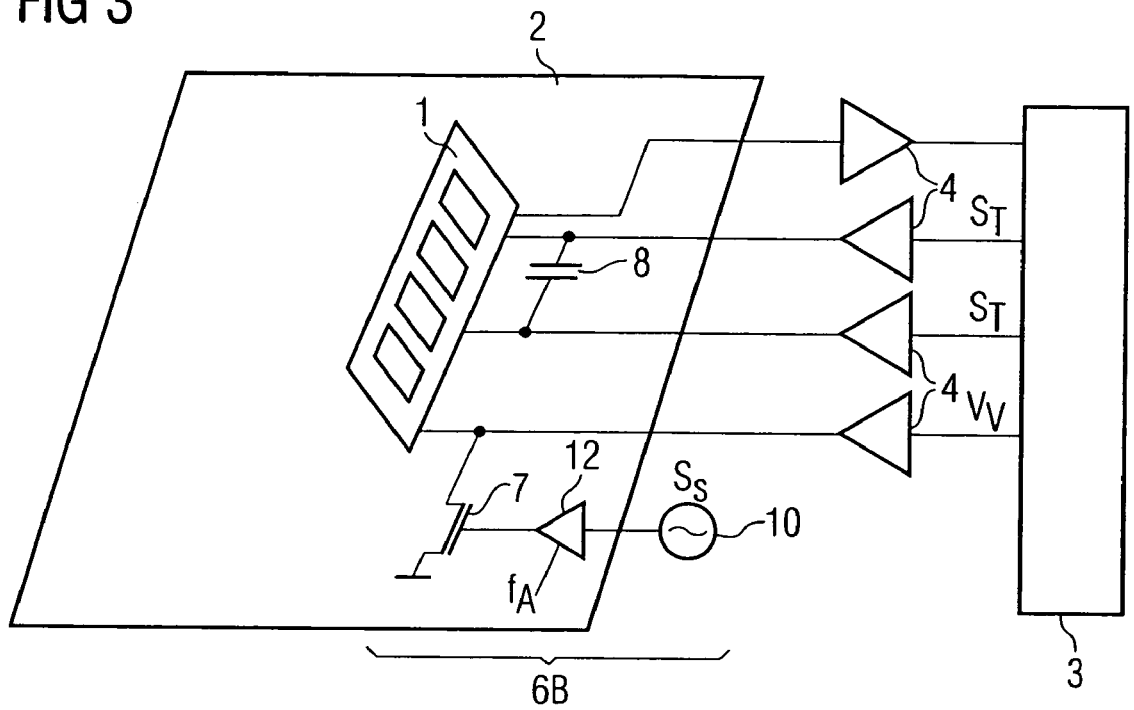
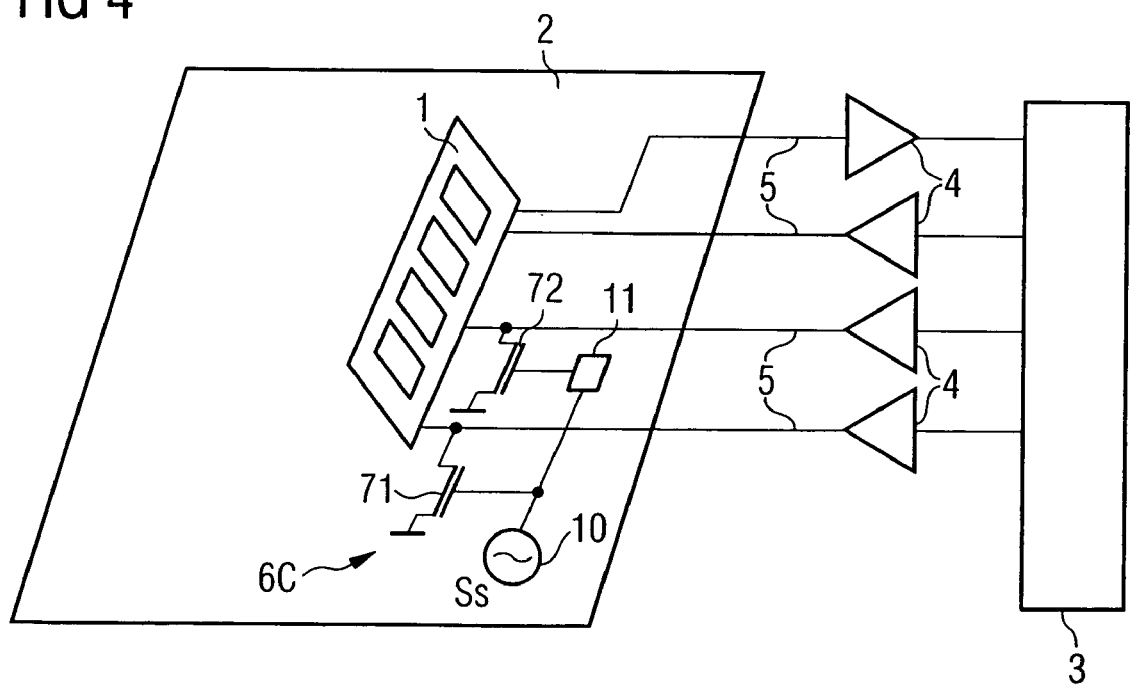

TEST SYSTEM AND TEST STRUCTURE FOR TESTING AN INTEGRATED CIRCUIT AND AN INTEGRATED CIRCUIT HAVING A TEST STRUCTURE

CROSS-REFERENCE TO RELATED APPLICATIONS

This application claims foreign priority benefits under 35 U.S.C. §119 to co-pending German patent application number DE 103 58 849.3, filed 16 Dec. 2003. This related patent application is herein incorporated by reference in its entirety.

BACKGROUND OF THE INVENTION

1. Field of the Invention

The invention relates to a test structure for testing an integrated circuit with a test unit and a test system. The invention also relates to an integrated circuit having external terminals by means of which the integrated circuit can be operated and tested. The invention furthermore relates to a method for testing an integrated circuit.

2. Description of the Related Art

Integrated circuits are tested several times during and after their fabrication before they are passed on to the customer for further processing. To this end, the integrated circuits are connected to a tester unit both at the wafer level (in the front end test) and in the encapsulated state (in the back end test). The tester unit then drives the integrated circuit, via connecting lines, in such a manner that it is possible to find out utilizing a test method whether the functioning of the integrated circuit corresponds to the desired functioning or whether the integrated circuit has a defect.

The tester unit is configured in such a manner that it applies tester signals having a very high signal quality to the integrated circuit via the connecting lines. The voltage supply for the integrated circuit can also be provided by the tester unit. In this case, stringent requirements are imposed on the voltage constancy of the voltage provided so that the tester unit is able to consistently reproduce defects which have occurred (e.g., detected) during test passes.

In spite of the fact that the integrated circuits are tested several times, defects occur when installing the integrated circuits in the end application, for example, at the customer's premises, even though the defects have not occurred or have not been noticed in the previous test passes. Interestingly, however, defects which lead to the corresponding integrated circuit being rejected but do not lead to defective functioning of the end application are also discovered in the test methods during and after the fabrication of the integrated circuit. It has hitherto not yet been fully understood why application testing in the end application is so effective, by comparison with the fabrication test methods, even if application testing takes place in a system environment, for example in a test environment, other than that in which the integrated circuit is intended to be subsequently used. However, application testing is very time-consuming, and there are no automatic handling systems for carrying out application testing. Since application testing requires a very large amount of time, the test throughput is reduced.

SUMMARY OF THE INVENTION

One aspect of the present invention provides a test structure, an integrated circuit and a test method, for detecting defects which occur only in an application environment in the integrated circuit to be tested.

In accordance with a first aspect of the present invention, provision is made of a test structure for testing an integrated circuit with a tester unit that has one or more connecting lines to connect the integrated circuit. A test signal and/or a supply voltage may be applied to the integrated circuit for the purposes of testing. An interference unit is also provided, which is connected to at least one of the connecting lines and reduces the quality of the test signal and/or the quality of the supply voltage in a manner dependent on an interference signal.

Thus, one embodiment of the invention provides a test structure that reduces the quality of the supply voltage applied and/or the quality of a test signal, with which the integrated circuit is to be tested, and simulates real conditions which occur in the subsequent end application. One aspect of the present invention is based on the realization that random effects such as, for example, interference as a result of signal crosstalk, noise or the like, may affect operation of the integrated circuit in the end application and, under certain circumstances, may lead to defects there which occur only when the corresponding interference is present but not when the integrated circuit is being operated with high-quality signals and/or supply voltages.

Since tester units are usually constructed in such a manner that they ensure precisely defined test signals and a high voltage constancy for voltages, conventional tester devices are not suited to carrying out a test method that tests the integrated circuit in a test environment that is similar to the end application. For this reason, provision is made, according to one embodiment of the invention, of an interference unit, which is coupled to at least one connecting line to reduce the quality of the test signal supplied by the tester unit and/or the quality of the supply voltage supplied by the tester unit. As a result, the test coverage may be markedly improved when testing integrated circuits since the test environment is approximated to the real conditions in the end application.

The interference unit may comprise a noise voltage source which provides a noise voltage as the interference signal.

The interference unit may, in particular, have a controllable resistor, which is arranged between the connecting line and a fixed potential, in particular a ground potential, and a control terminal, to which the interference signal from an interference source can be applied to change the resistance in a manner dependent on the interference signal emitted by the interference source. This represents a particularly simple way of connecting an interference unit to a conventional tester unit without having to modify the construction of the tester unit.

The quality of the test signal may be determined by the signal-to-noise ratio, and the quality of the supply voltage may be determined by the voltage constancy.

Alternatively, the interference signal may be a coupling signal that simulates signal injection of the further signal onto the connecting line. This is necessary, in particular, because signal coupling is essentially avoided in conventional tester units by means of complex shielding measures. Provision may furthermore be made for the quality of the test signal to be determined by parameters such as edge steepness and/or level voltage constancy.

In accordance with a further aspect of the present invention, provision is made of a test system having a test structure and a connected integrated circuit. The integrated circuit may, in particular, be arranged on a wafer and be capable of being contact-connected by means of one or more contact-connection devices, for example, contact-connection needles, which are connected to the connecting lines. Alternatively, the integrated circuit may already be integrated in a module which is connected to the connecting lines such that tests are performed on the integrated circuit together with the module.

In accordance with a further aspect of the present invention, provision is made of an integrated circuit having a functional circuit, which may be operated and tested via external terminals, and an interference unit. The interference unit generates an interference signal during a test operation and thus to affect an internal interconnect of the integrated circuit so that the quality of a signal present on the interconnect and/or the quality of a supply voltage applied to the interconnect is/are reduced.

The interference unit may be integrated in the integrated circuit, with the result that there is no need to modify the test environment. The interference unit may be activated by means of a test mode, with the result that the interference unit is activated only when testing the integrated circuit but not during normal operation. The interference unit, when provided within the integrated circuit, may affect signals which are not accessible from the outside, for example, in a manner dependent on the interference signal to simulate internal noise that can arise as a result of the integrated circuit being operated in an interference environment. The interference unit may, in particular, be connected to an interconnect that is a supply line of the integrated circuit for an internal and/or external supply voltage.

The interference unit may have a controllable resistor, e.g., a field effect transistor, which is driven by the interference signal of an interference source.

Alternatively, the interference unit may be connected to an internal voltage source, which regulates an internal supply voltage in accordance with a reference voltage, the interference signal being applied to the reference voltage.

In accordance with a further aspect of the present invention, provision is made of a method for testing an integrated circuit. During testing of the integrated circuit with a tester unit, one or more internally or externally provided signals and/or one or more supply voltages are affected, in accordance with a test mode, in a manner dependent on an interference signal, with the result that the quality of the signal and/or the quality of the supply voltage is/are reduced.

BRIEF DESCRIPTION OF THE DRAWINGS

Preferred embodiments of the invention are explained in more detail below with reference to the accompanying drawings, in which:

FIG. 3 shows a test structure according to a second embodiment of the invention;

FIG. 4 shows a test structure according to a third embodiment of the invention;

DETAILED DESCRIPTION OF THE PREFERRED EMBODIMENT

Figure 1:
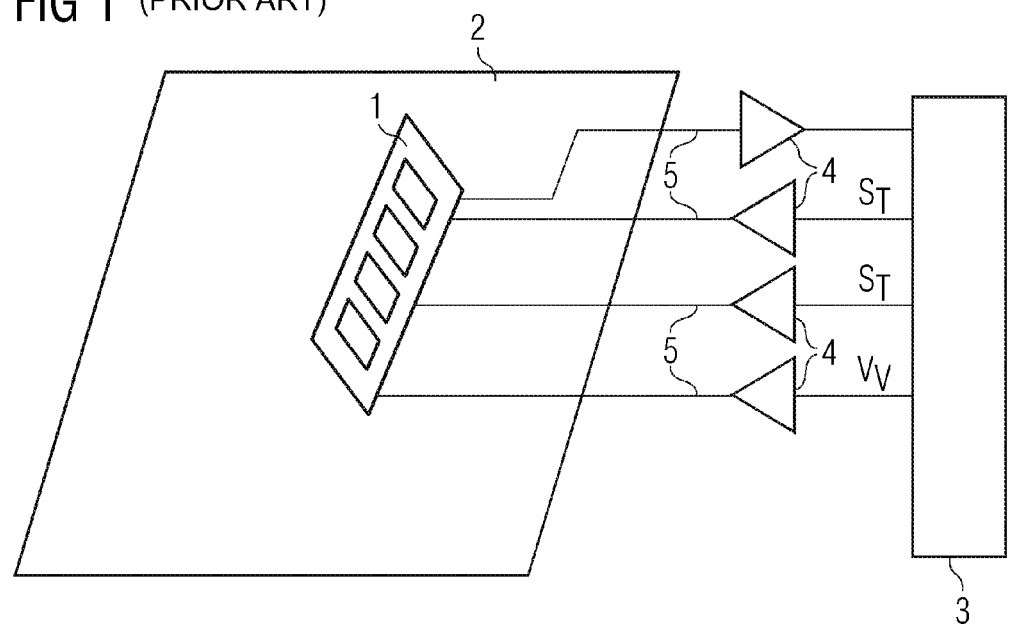
FIG. 1 shows a test system in accordance with the prior art.

FIG. 1 illustrates a test system, in which a circuit module 1 that is arranged on a base board 2 is intended to be tested. The circuit module 1 has, for example, integrated memory circuits, the functioning of which is intended to be tested with the aid of the tester unit 3. The tester unit 3 has inputs/outputs having respective input/output drivers 4 which are connected to the circuit module 1 via connecting lines 5 and via interconnects on the base board 2.

The tester unit 3 may be a conventional tester unit that provides both the supply voltages $V_V$ and the test signals $S_T$ for testing the circuit module 1. However, the supply voltage $V_V$ and test signals $S_T$ can also be provided by structurally separate units.

The test signals $S_T$ provided have a high signal quality, that is to say they have a very large signal-to-noise ratio, are substantially shielded with respect to other signals, and the tolerances with respect to the desired voltage level and with respect to the time behavior are as low as possible. The voltage constancy of a supply voltage $V_V$ provided is furthermore very high and is affected only to a small extent by external or internal interfering influences. This high quality of the test signals $S_T$ and also of the supply voltages $V_V$ in a conventional test system is required for a test method that is used to test the functionality of the integrated circuit in order to set precisely defined states which makes it possible to find defects in a reproducible manner and to be able to ascertain the cause of the defect.

In spite of the fact that the integrated circuit is tested in a complex manner on the circuit module 1, a defect may still occur in the end application of an integrated circuit that has been tested as being free of defects. It has hitherto not been possible to explain the cause of such a defect in detail. However, it is assumed that the defects are caused by interference signals.

Since testing the integrated circuit in the application environment would be very complicated and would result in a low test throughput, one aspect of the invention provides for testing the integrated circuit under conditions similar to those in the application by applying an interference signal to the test signals and/or the supply voltages in a pseudo-application test. As a result, the signal quality of the test signals and/or the quality of the supply voltage may be impaired by comparison with the quality provided by the tester unit. Under such test conditions, defects which would not be discovered during conventional testing may be detected.

Figure 2:
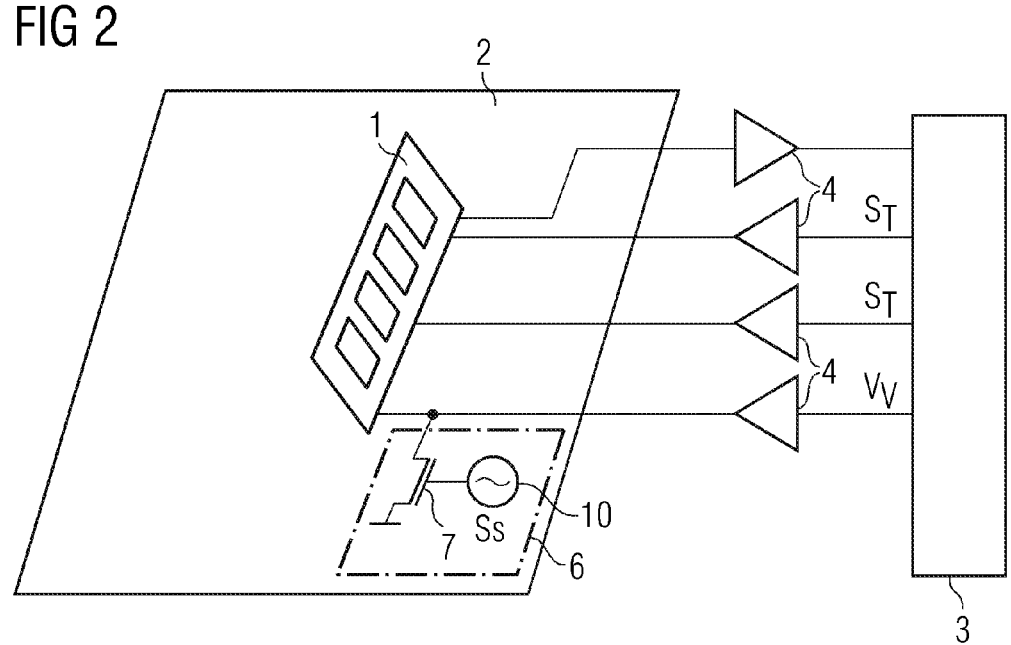
FIG. 2 shows a test structure according to a first embodiment of the invention.

FIG. 2 illustrates a first exemplary embodiment of a test structure, in which the voltage constancy of a supply voltage $V_V$ is impaired utilizing an interference unit 6A. The interference unit 6A includes a controllable resistor 7, for example, in the form of a field effect transistor, to the control input of which an interference signal $S_S$ is applied. The interference signal $S_S$ is utilized to change the resistance of the controllable resistor 7 and thus to impair the voltage constancy of the supply voltage $V_V$ by means of changing resistances. The interference unit 6 is configured in such a manner that the supply voltage $V_V$ fluctuates about the desired supply voltage in a manner dependent on the interference signal $S_S$ applied. The level of the applied interference signal on the supply line may be determined by the properties of the corresponding voltage regulator that generates the supply voltage and also by the capacitances connected to the supply line.

FIG. 3 illustrates a test structure according to a second embodiment of the invention. As shown, the interference unit 6B comprises a coupling element 8, which is arranged between two connecting lines 5 to couple over signals between the connecting lines 5. The coupling element 8 may be in the form of a capacitance that is arranged between the connecting lines 5. This capacitance may also be provided in such a manner that it can be regulated.

The interference signal $S_S$ may, in particular, have a noise signal, for example, white or gray noise, which is applied, in a form amplified by a controllable amplifier 12, to the control input of the controllable resistor 7 in such a manner that the resistance of the controllable resistor 7 changes in a manner dependent on the noise signal $S_S$. This is expedient since noise frequently occurs when inserting the integrated circuit into the subsequent end application and could be one of the main sources of defects in electronic circuits.

FIG. 4 illustrates a test structure according to a third embodiment of the invention. As shown, the interference unit 6C comprises one interference signal source 10 and a plurality of controllable resistors 71, 72 which are connected to the base board 2 and to a circuit module 1 via respective connecting lines 5. The same interference signal $S_S$ that is provided by the interference signal source 10 is applied to the control inputs of the controllable resistors 71, 72. To prevent the interfering effects from compensating for each other, a delay element 11 may be provided between the interference signal source 10 and the second controllable resistor 72 and utilized to delay the interference signal applied to the second controllable resistor 72. The temporally staggered interference signal is thus applied to the respective connecting lines 5 which are connected to the controllable resistors 71, 72. Since the interference signal is preferably a random signal, there is essentially no correlation between the interference signals on the corresponding connecting lines.

Figure 5:
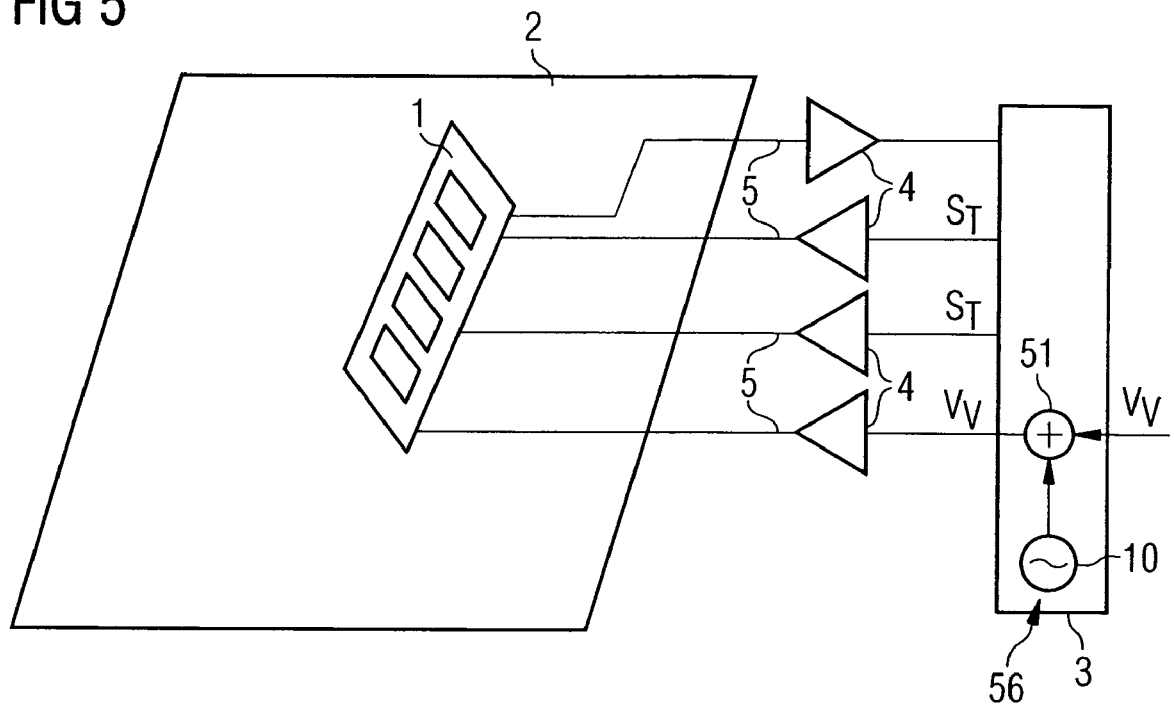
FIG. 5 shows a test structure according to a fourth embodiment of the invention.

FIG. 5 illustrates a fourth embodiment of the present invention. In contrast to the refinements of the preceding embodiments, the interference unit 56 is arranged in the tester unit 3, as a result of which it is possible to supply the interference signal to the respective test signal and/or the respective supply voltage as early as during generation of the test signal and/or the supply voltage, with the result that it is not necessary to intervene in the connecting lines.

As described above, the interference signal source 10 may be a noise source. However, the interference source may be configured to provide a randomly generated interference signal. A pseudo-random interference signal may also be utilized. The pseudo-random interference signal may be a signal that has random level sequences but can be reproduced, with the result that, if a defect occurs, the defect can be reproduced when applying the interference signal again. In this embodiment, the search for the cause of the defect may be simplified. The intensity of the interference signal source may furthermore be set so that it is possible to carry out a plurality of test passes using various strengths of the interference signal $S_S$, with the result that the sensitivity of the integrated circuit with respect to the interference signals $S_S$ may be determined.

In one embodiment, the interference signals may be added multifariously to the test signals and the supply voltages to "impair" the latter, with the result that the integrated circuit may be tested under conditions similar to those in the application. The interference signal $S_S$ may thus, for example, also be added (via a combining/addition element 51) in the amplification stage of the output amplifiers of the tester unit 3.

Figure 6:
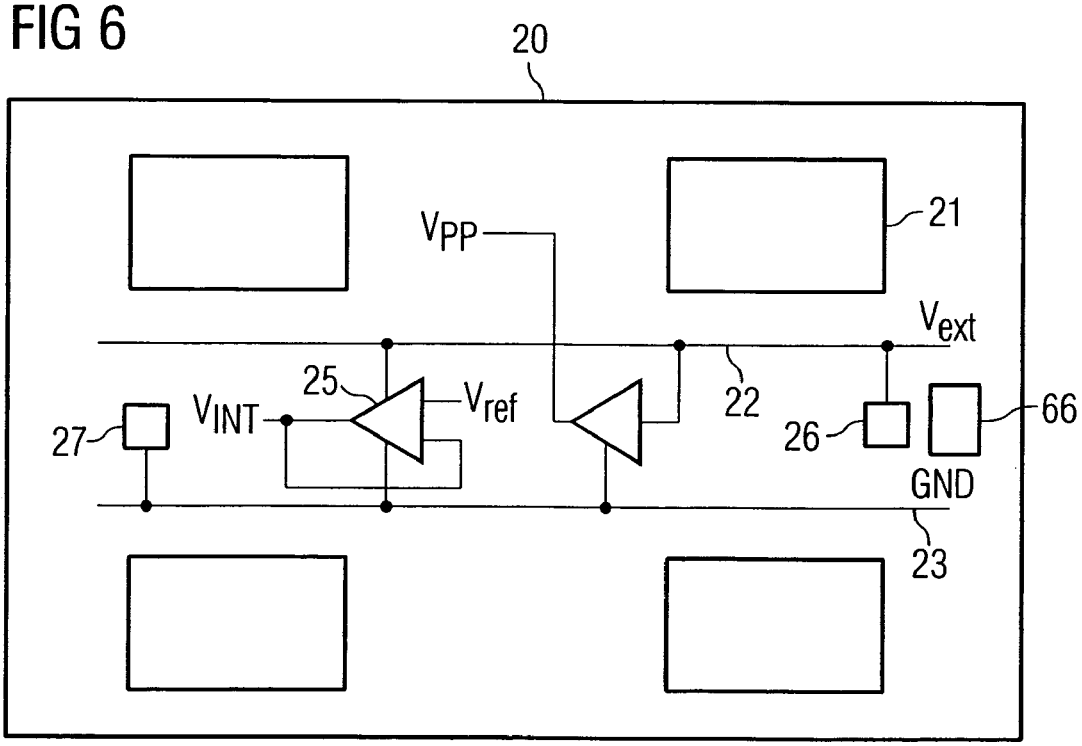
FIG. 6 shows an integrated circuit in accordance with a fifth embodiment of the invention.

FIG. 6 illustrates, by way of example, an integrated circuit in accordance with a fifth embodiment of the present invention. In this embodiment, the interference unit 66 is integrated in the integrated circuit 20, which is to be tested, and can be activated in accordance with a test mode. The integrated circuit to be tested is, in particular, a memory circuit 20 having a plurality of memory cell arrays 21.

The integrated circuit 20 includes a first supply voltage line 22 for an external supply voltage $V_{EXT}$ and a second supply voltage line 23 for a ground potential GND. The external supply voltage $V_{EXT}$ and the ground potential GND are provided via external terminals 26, 27, respectively, of the integrated circuit 20, for example by a tester unit. The internal supply voltage $V_{INT}$ is generated from the external supply voltage $V_{EXT}$ by an internal voltage source 25 and is provided in a manner dependent on an internally or externally provided reference voltage $V_{REF}$. The interference unit 66 may be connected to one or more of the first supply voltage line 22, the second supply voltage line 23 and a line connected to internal supply voltage $V_{INT}$. The interference units may be of the same construction as the variants (described previously and in more detail below) having the test structure according to embodiments the invention.

Figure 7A:
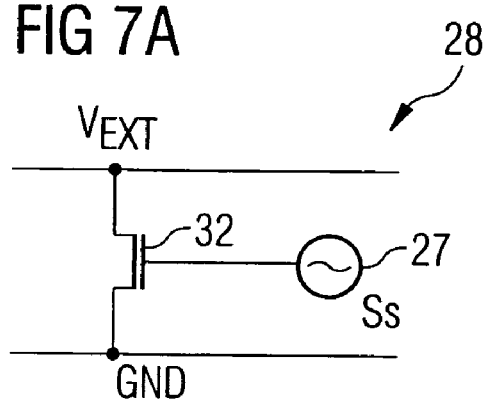
FIGS. 7a to 7d show exemplary embodiments of interference units for use in the test structure or in the integrated circuit.
Figure 7B:
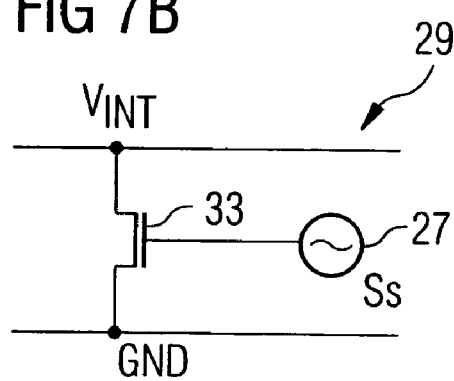

FIGS. 7a to 7d illustrate a plurality of variants of the interference unit 66. As shown in FIGS. 7a and 7b, respective controllable transistors 32, 33 may be provided, for interference units 28, 29, respectively, between the first supply voltage line 22 and a fixed potential, e.g., a ground potential, and between the internal supply voltage $V_{INT}$ and the fixed potential, e.g., the ground potential GND. The controllable transistors may be driven directly or indirectly from an internal interference signal source 27.

Figure 7C:
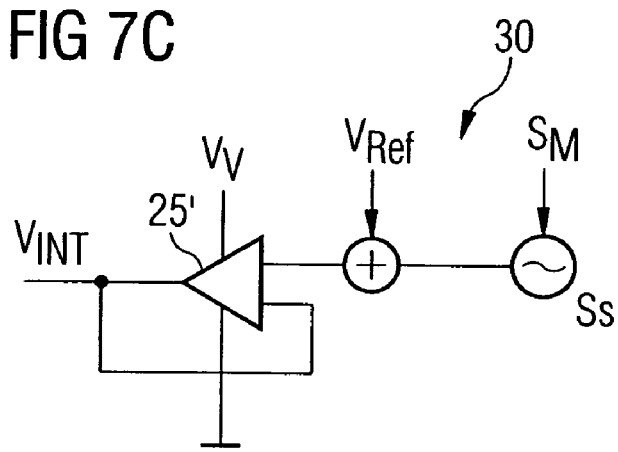

FIG. 7c illustrates an interference unit 30 having an internal supply voltage source which sets the internal supply voltage $V_{INT}$ to a reference voltage $V_{REF}$ and superposes the interference signal $S_S$ on the internal supply voltage $V_{INT}$ (i.e., the interference voltage is added to the supply voltage), wherein the interference signal $S_S$ is superposed on the reference voltage $V_{REF}$ that is provided for the internal supply voltage source 25'.

Figure 7D:
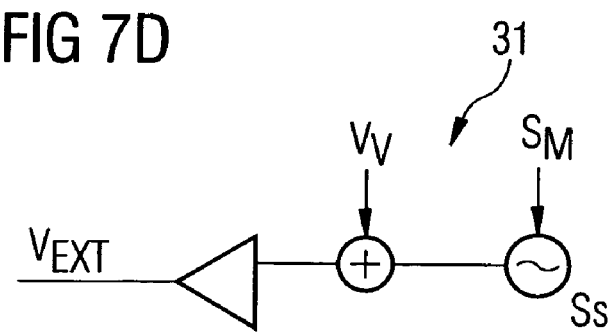

FIG. 7d illustrates an interference unit 30 in which the interference signal is added to the supply voltage $V_V$. The external supply voltage $V_{EXT}$ is provided by amplifying the supply voltage $V_V$ that has had the interference signal $S_S$ superposed on it.

The interference signal source may be provided in such a manner that it can be switched on or off in accordance with a test mode signal $S_M$, wherein an interference signal $S_S$ is not applied to the respective external supply voltage and/or the respective internal signal when the interference signal source is switched off. The interference signal source may be likewise realized in the integrated circuit 20 and may be provided both as a noise source and as an interference signal source for a random interference signal or for a pseudo-random interference signal.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
   a functional circuit having one or more connecting lines connectable to at least one of a test signal, an internal supply voltage and an external supply voltage;
   an interference unit for generating an interference signal during a test operation, the interference unit disposed in connection to at least one of the connecting lines and configured to modify at least one of the test signal, the internal supply voltage and the external supply voltage on the respectively connected connecting lines based on the interference signal;

wherein the one or more connecting lines include at least one of an internal voltage supply line of the integrated circuit and an external voltage supply line; and wherein the interference unit is connected to an internal voltage source which regulates internal supply voltage in accordance with a reference voltage, wherein the interference signal is superposed onto the reference voltage.

2. An integrated circuit, comprising:

a functional circuit having one or more connecting lines connectable to at least one of a test signal, an internal supply voltage and an external supply voltage, wherein the one or more connecting lines include at least one of an internal supply voltage line of the integrated circuit and an external supply voltage line; and an interference unit for generating an interference signal during a test operation, the interference unit disposed in connection to at least one of the connecting lines and configured to modify at least one of the test signal, the internal supply voltage and the external supply voltage on the respectively connected connecting lines based on the interference signal, wherein the interference unit comprises:

a transistor connected between a fixed potential and one of the internal supply voltage line of the integrated circuit and the external supply voltage line; and an interference source connected to drive the transistor.

3. The integrated circuit of claim 2, further comprising:

one or more external terminals connected to the one or more connecting lines, wherein the test signal and the external supply voltage are provided from a tester unit via the external terminals.

4. The integrated circuit of claim 2, wherein the interference signal is superposed onto a supply voltage to generate the external supply voltage applied to the integrated circuit.

5. The integrated circuit of claim 2, wherein the interference unit is selectively activated with a test mode signal.

6. A method for testing an integrated circuit, comprising:

applying an interference signal to at least one of an internal supply voltage and an external supply voltage during testing of the integrated circuit with a tester unit in accordance with a test mode, wherein the interference signal reduces at least one of a supply voltage quality of the internal supply voltage and a supply voltage quality of the external supply voltage.

* * * * *